United States Patent
Nomoto et al.

(10) Patent No.: US 6,432,621 B1
(45) Date of Patent: Aug. 13, 2002

(54) RESIST DEVELOPER

(75) Inventors: Shougo Nomoto; Akimitsu Sakai, both of Wakayama; Kozo Kitazawa, Tokyo, all of (JP)

(73) Assignee: Kao Corporation, Tokyo (JP)

( * ) Notice: Subject to any disclaimer, the term of this patent is extended or adjusted under 35 U.S.C. 154(b) by 0 days.

(21) Appl. No.: 09/474,802

(22) Filed: Dec. 29, 1999

(30) Foreign Application Priority Data

Jan. 7, 1999 (JP) .......................................... 11-002173

(51) Int. Cl.⁷ ................................................. G03F 7/32
(52) U.S. Cl. ...................................................... 430/331
(58) Field of Search ......................................... 430/331

(56) References Cited

U.S. PATENT DOCUMENTS

| 4,039,371 | A |   | 8/1977  | Brunner et al. .............. 156/668 |
| 4,820,621 | A |   | 4/1989  | Tanka et al. ................. 430/331 |
| 5,106,724 | A |   | 4/1992  | Nogami et al. .............. 430/331 |
| 5,279,918 | A |   | 1/1994  | Nishi et al. .................. 430/190 |
| 5,378,585 | A |   | 1/1995  | Watanabe .................... 430/176 |
| 5,837,425 | A | * | 11/1998 | Nakanishi et al. ........... 430/331 |
| 5,972,862 | A |   | 10/1999 | Torii et al. ................... 510/175 |

FOREIGN PATENT DOCUMENTS

| JP | A59142547 | 8/1984 |
| JP | A59501482 | 8/1984 |
| JP | A62175738 | 8/1987 |
| JP | A63025650 | 2/1988 |
| JP | B573228 | 10/1993 |
| JP | B638159 | 5/1994 |
| JP | A7333863 | 12/1995 |
| WO | WO8400826 | 3/1984 |

OTHER PUBLICATIONS

Derwent Abstracts, JP 5–073228, Oct. 13, 1993.
Derwent Abstracts, JP 60–223120, Nov. 7, 1985.

* cited by examiner

*Primary Examiner*—Hoa Van Le
(74) *Attorney, Agent, or Firm*—Birch, Stewart, Kolasch & Birch, LLP

(57) ABSTRACT

A resist developer obtained by a process comprising mixing (1) at least one compound selected from the group consisting of a basic compound A and an organic compound B having phenolic hydroxyl group and carboxyl group in a molecule, and/or (2) a salt C formed between the basic compound A and the organic compound B. The resist developer exhibiting excellent dissolution selectivity, and developing a resist in a short period of time, can be used for developing positive and negative resists.

22 Claims, No Drawings

RESIST DEVELOPER

BACKGROUND OF THE INVENTION

1. Field of the Invention

The present invention relates to a resist developer, and more particularly to a resist developer which can be suitably used for forming an image (patterns) from a positive or negative resist such as an azide compound resist or a chemical amplification resist.

2. Discussion of the Related Art

Conventionally, it has been required in the field of the art relating to lithography employed in the production of semiconductor devices and liquid crystal display devices that the dissolution selectivity of a photoresist and uniformity of fine patterns formed from the photoresist are improved. In order to satisfy the above requirement, as a positive or negative resist, there has been developed a high resolution resist such as an azide compound resist or a chemical amplification resist, the base resin of which is an alkali-soluble polymer. Also, as a developer for the resist, an aqueous solution of a quaternary ammonium hydroxide and the like has been proposed.

When the aqueous solution of a quaternary ammonium hydroxide, however, alone is used as a developer, it cannot be satisfactory in the field of the art requiring high resolution, because the dissolution selectivity of a resist is lowered as the resist patterns become fine.

In order to improve the dissolution selectivity of a resist, there has been proposed a developer prepared by mixing an aqueous solution of a quaternary ammonium hydroxide and the like with an alkylene oxide compound (Japanese Examined Patent Publication Nos. Hei 6-38159 and Hei 5-73228). The proposed developer, however, does not satisfy the required dissolution selectivity to a resist.

An object of the present invention is to provide a resist developer showing excellent dissolution selectivity, which promotes the solubility of a resist in a soluble portion and inhibits the solubility of a resist in a non-soluble portion to form uniform fine resist patterns, and capable of developing a resist in a short period of time.

These and other objects of the present invention will be apparent from the following description.

SUMMARY OF THE INVENTION

In sum, the present invention pertains to the followings:

[1] a resist developer obtained by a process comprising mixing:
  (1) at least one compound selected from the group consisting of a basic compound A and an organic compound B having phenolic hydroxyl group and carboxyl group in a molecule, with
  (2) a salt C formed between the basic compound A and the organic compound B;

[2] a resist developer obtained by a process comprising mixing a basic compound A and an organic compound B having phenolic hydroxyl group and carboxyl group in a molecule;

[3] a resist developer comprising a salt C formed between a basic compound A and an organic compound B having phenolic hydroxyl group and carboxyl group in a molecule;

[4] the resist developer according to item [3] above, further comprising at least one of the basic compound A and the organic compound B;

[5] the resist developer according to any one of items [1] to [4] above, further comprising an alkylene oxide compound; and

[6] a method for developing a resist, comprising applying the resist developer according to any one of items [1] to [4] above.

DETAILED DESCRIPTION OF THE INVENTION

In one embodiment, a resist developer is obtained by a process comprising mixing:
  (1) at least one compound selected from the group consisting of a basic compound A and an organic compound B having phenolic hydroxyl group and carboxyl group in a molecule, with
  (2) a salt C formed between the basic compound A and the organic compound B.

In another embodiment, a resist developer is obtained by a process comprising mixing a basic compound A and an organic compound B having phenolic hydroxyl group and carboxyl group in a molecule.

In the present specification, the phrase "a salt C formed between a basic compound A and an organic compound B having phenolic hydroxyl group and carboxyl group (hereinafter merely referred to as "organic compound B") is intended to mean that the salt C is composed of a salt formed between the basic compound A and the organic compound B, and/or a dissociated substance generated from the salt C.

The raw material used for the developer of the present invention includes, for instance, a combination of the basic compound A and the organic compound B; the salt C; a combination of the basic compound A, the organic compound B and the salt C; and a combination of the basic compound A and the salt C. The developer can be prepared, for instance, by dissolving the raw material in water.

In still another embodiment, the resist developer comprises a salt C, and may further comprise a basic compound A and/or an organic compound B.

Examples of the basic compound A include basic inorganic compounds such as sodium hydroxide, potassium hydroxide, sodium hydrogencarbonate, sodium carbonate, sodium silicate, sodium metasilicate, trisodium phosphate, disodium hydrogenphosphate, and ammonia; primary amines such as ethylamine, n-propylamine, n-butylamine and 1,3-diaminopropane; secondary amines such as diethylamine, di-n-propylamine, di-n-butylamine and 4,4'-diaminodiphenylamine; tertiary amines such as n,n-dimethylethylamine, n,n-diethylmethylamine and triethylamine; imines such as bis(dialkylamino)imines; alkanolamines such as monoethanolamine, diethanolamine, triethanolamine, diethylethanolamine and propanolamine; amides such as formamide and acetamide; basic heterocyclic compounds having one or more hetero-atoms selected from nitrogen atom, oxygen atom and sulfur atom in its ring structure having 3 to 5 carbon atoms, such as pyrrole, pyrrolidine, pyrrolidone, pyridine, morpholine, pyrazine, piperidine, oxazole and thiazole; a quaternary ammonium hydroxide represented by the formula (II):

wherein each of $R^4$, $R^5$, $R^6$ and $R^7$ is independently an alkyl group having 1 to 6 carbon atoms, an aralkyl group having 7 or 8 carbon atoms, an alkenyl group having 2 to 6 carbon atoms, an aryl group having 6 to 8 carbon atoms, a hydroxyalkyl group having 1 to 6 carbon atoms or an alkoxyalkyl group having 2 to 6 carbon atoms, and the like. Those basic compounds A can be used alone or in admixture of two or more kinds thereof.

Concrete examples of the quaternary ammonium hydroxide represented by the formula (II) include tetramethylammonium hydroxide (hereinafter referred to as "TMAH"), tetraethylammonium hydroxide, tetrabutylammonium hydroxide, tributylmethylammonium hydroxide, trimethylhydroxyethylammonium hydroxide (hereinafter referred to as "choline"), tetraethanolammonium hydroxide, methyltriethanolammonium hydroxide, and the like.

Among the basic compound A, from the viewpoint of inhibiting corrosion of a circuit pattern of a wiring plate, the basic organic compound is preferable. Further, among the basic compounds, from the viewpoint of the dissolution selectivity, the quaternary ammonium hydroxide is preferable. Also, it is desirable that each of $R^4$, $R^5$, $R^6$ and $R^7$ in the formula (II) has 1 to 4 carbon atoms, preferably 1 or 2 carbon atoms, respectively. Concretely, TMAH and choline are particularly preferable.

The term "dissolution selectivity" of the resist developer described in the present specification is intended to mean a nature which promotes the solubility of a soluble region of a resist, and which inhibits the solubility of a non-soluble region of a resist. For instance, when a positive resist is developed with the resist developer, a region of the resist to which ultraviolet rays, far ultraviolet rays, excimer lasers, X-rays or electron beams are irradiated, corresponds to the soluble region of a resist, and a region of the resist to which no rays are exposed, corresponds to the non-soluble region of a resist.

Also, the term "phenolic hydroxyl group of the organic compound B" described in the present specification refers to one in which —OH group or —SH group is bonded directly to carbon atom of benzene nucleus, a condensed ring such as naphthalene nucleus, or an aromatic ring such as biphenyl.

Further, a part or all of oxygen atoms of carboxyl groups of the organic compound B may be substituted with sulfur atoms.

Examples of the compound B include a compound in which carboxyl group is bonded directly to an aromatic ring, and the like. Concrete examples of the compound include monocarboxylic acids having benzene nucleus such as salicylic acid, m-hydroxybenzoic acid, p-hydroxybenzoic acid, 3-methylsalicylic acid, 3-hydroxy-4-methylbenzoic acid, 2-hydroxy-3-isopropylbenzoic acid, 2-hydroxy-3-isopropyl-6-methylbenzoic acid, 3,5-di-tert-butyl-4-hydroxybenzoic acid, 3-hydroxy-4-methoxybenzoic acid, syringic acid, 2,4-dihydroxybenzoic acid, 3,5-dihydroxybenzoic acid, gallic acid, 3-aminosalicylic acid, 3-amino-4-hydroxybenzoic acid, 4-hydroxy-3-nitrobenzoic acid, 2-hydroxy-5-nitrobenzoic acid, 4-hydroxy-3,5-dinitrobenzoic acid, 3-hydroxy-4-methyl-2-nitrobenzoic acid, 5-fluorosalicylic acid, 4-chlorosalicylic acid, 5-bromosalicylic acid, 3,5-dichloro-4-hydroxybenzoic acid, 4-bromo-3,5-dihydroxybenzoic acid, 3,5-diiodosalicylic acid, 3,5,6-trichlorosalicylic acid, m-hydroxythiobenzoic acid and p-hydroxydithiobenzoic acid; dicarboxylic acids having benzene nucleus such as 5-formylsalicylic acid, 5-hydroxyisophthalic acid and 2,5-dihydroxyterephthalic acid; monocarboxylic acids having naphthalene nucleus such as 1-hydroxy-2-naphthoic acid and 1,4-dihydroxy-2-naphthoic acid; dicarboxylic acids having naphthalene nucleus such as pamoic acid; and monocarboxylic acids having biphenyl such as 4'-hydroxy-4-biphenylcarboxylic acid. Those organic compounds B can be used alone or in admixture of two or more kinds.

Other examples of the organic compound B include a compound in which carboxyl group is bonded to an aromatic ring via a linear or branched, saturated or unsaturated hydrocarbon group, and the like. Concrete examples of the compound include monocarboxylic acids having benzene nucleus such as 2-hydroxyphenylacetic acid, 3-hydroxyphenylacetic acid, 3-(4-hydroxyphenyl)propionic acid, 2-(4-hydroxyphenoxy)propionic acid, (±)-4-hydroxymandelic acid, 4-hydroxy-3-methoxyphenylacetic acid, (±)-3-hydroxy-4-methoxymandelic acid, DL-3,4-dihydroxymandelic acid, 3,4-dihydroxyphenylacetic acid, 2-hydroxycinnamic acid, 3-hydroxycinnamic acid, 4-hydroxycinnamic acid, 3-hydroxy-4-methoxycinnamic acid, 3,4-dihydroxycinnamic acid, 4,4-bis(4-hydroxyphenyl)valeric acid, p-hydroxyphenylpyruvic acid, 4-hydroxy-3-nitrophenylacetic acid, 3-fluoro-4-hydroxyphenylacetic acid, 3-chloro-4-hydroxyphenylacetic acid and α-ethyl-3-hydroxy-2,4,6-triiodohydrocinnamic acid; and dicarboxylic acids having benzene nucleus such as 2,5-dihydroxy-1,4-bezenediacetic acid.

Further examples of the organic compound B include a compound in which a part of carboxyl group of a polycarboxylic acid, a polythiocarboxylic acid, a polydithiocarboxylic acid or the like is esterified by an alcohol or an alkylene oxide adduct thereof; a compound in which a part of carboxyl group of a polycarboxylic acid, a polythiocarboxylic acid, a polydithiocarboxylic acid or the like is amidated, imidated or esterified by an amine or an alkylene oxide adduct thereof; and the like.

Examples of the alcohol and an alkylene oxide adduct thereof include a linear saturated alcohol, a branched saturated alcohol, a linear unsaturated alcohol, a branched unsaturated alcohol, an alcohol having an aromatic ring, an alcohol having an alicyclic ring or heterocyclic ring, a polyhydric alcohol, ethylene oxide adducts thereof, propylene oxide adducts thereof, ethylene oxide and propylene adducts thereof, and the like. Each of these alcohols has 1 to 18 carbon atoms.

Examples of the amine and an alkylene oxide adduct thereof include a linear saturated amine, a branched saturated amine, a linear unsaturated amine, a branched unsaturated amine, an amine having an aromatic ring, an amine having an alicyclic ring or heterocyclic ring, a polyamine, ethylene oxide adducts thereof, propylene oxide adducts thereof, ethylene oxide and propylene adducts thereof, and the like. Each of these amines has 1 to 18 carbon atoms.

Among the organic compounds B, from the viewpoint of the dissolution selectivity, a compound in which carboxyl group is directly bound to an aromatic ring, and a compound in which carboxyl group is bound to an aromatic ring via a linear or branched, saturated or unsaturated hydrocarbon group are preferable.

It is preferable that the molecular weight of the organic compound B is from 138 to 500, more preferably 138 to 300 and particularly preferably 138 to 200, from the viewpoint of the dissolution selectivity.

In addition, from the viewpoint of further improving the dissolution selectivity, a preferable organic compound B includes a carboxylic acid represented by the formula (I):

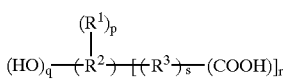

(I)

wherein $R^1$ is a linear or branched, saturated or unsaturated hydrocarbon group having 1 to 4 carbon atoms, wherein the hydrocarbon group of $R^1$ may have one oxygen atom; $R^2$ is an unsaturated hydrocarbon group comprising a cyclic skeleton having 6 to 14 carbon atoms; $R^3$ is a linear or branched, saturated or unsaturated hydrocarbon group having 1 to 4 carbon atoms, wherein hydrogen atom bonded to carbon atom of $R^3$ may be substituted by —OH group, and at least one oxygen atom of q number of —OH group may be substituted by sulfur atom, at least one oxygen atom of r number of —COOH group may be substituted by sulfur atom; p is an integer of 0 to 3; q is an integer of 1 to 3; s is 0 or 1; and r is 1 or 2.

Concrete examples of the organic compound B in which s is 0 in the formula (I) include monocarboxylic acids having benzene nucleus such as salicylic acid, m-hydroxybenzoic acid, p-hydroxybenzoic acid, 3-hydroxy-4-methylbenzoic acid, 3-hydroxy-4-methoxybenzoic acid, syringic acid, 2,4-dihydroxybenzoic acid, gallic acid, m-hydroxythiobenzoic acid, and p-hydroxydithiobenzoic acid; dicarboxylic acids having benzene nucleus such as 5-hydroxyisophthalic acid and 3,5-dihydroxyterephthalic acid; monocarboxylic acids having naphthalene nucleus such as 1-hydroxy-2-naphthoic acid and 1,4-dihydroxy-2-naphthoic acid; and monocarboxylic acids having biphenyl such as 4'-hydroxy-4-biphenylcarboxylic acid.

Also, concrete examples of the organic compound B in which s is 1 in the formula (I) include monocarboxylic acids having benzene nucleus such as 2-hydroxyphenylacetic acid, 3-hydroxyphenylacetic acid, (±)-4-hydroxymandelic acid, 4-hydroxy-3-methoxyphenylacetic acid, 3,4-dihydroxyphenylacetic acid, 4-hydroxycinnamic acid and 3,4-dihydroxycinnamic acid; and dicarboxylic acids having benzene nucleus such as 2,5-dihydroxy-1,4-bezenediacetic acid.

Among those organic compounds B, it is preferable in the formula (I) that $R^1$ is a linear, saturated or unsaturated hydrocarbon group having 1 or 2 carbon atoms; $R^2$ is an unsaturated hydrocarbon group comprising a cyclic skeleton having 6 to 12 carbon atoms; and $R^3$ is a linear, saturated or unsaturated hydrocarbon group having 1 or 2 carbon atoms, from the viewpoint of the dissolution selectivity. Furthermore, it is more preferable that $R^2$ is an unsaturated hydrocarbon group comprising a cyclic skeleton having 6 to 12 carbon atoms, and that $R^1$ and $R^3$ do not exist.

In the formula (I), p is preferably an integer of 0 to 2, more preferably 0 or 1, still more preferably 0, from the viewpoint of the dissolution selectivity.

Also, it is more preferable that q is 1 or 2, and still more preferably 1, from the viewpoint of the dissolution selectivity. Further, it is more preferable that s is 0, and that r is 1, from the viewpoint of the dissolution selectivity. In particular, m-hydroxybenzoic acid, p-hydroxybenzoic acid and 2,4-dihydroxybenzoic acid are preferable.

The salt C which is contained in the resist developer can be obtained, for instance, by:

(1) a process comprising adding a salt C formed between a basic compound A and an organic compound B to water,
(2) a process comprising adding a basic compound A and an organic compound B to water to form the salt C, and the like.

Among the salts C, it is more desirable to use a salt formed between a preferable one among the basic compounds A and a preferable one among the organic compounds B, from the viewpoint of the dissolution selectivity.

It is desirable that the solubility at 25° C. of each of the organic compound B and the salt C to 100 parts by weight of a 2% by weight TMAH aqueous solution is 0.001 parts by weight or more, preferably 0.05 parts by weight or more, more preferably 0.1 parts by weight or more, from the viewpoint of the dissolution selectivity. Also, it is desirable that the first dissociation constant of pKa at 25° C. of the organic compound B is from 0.1 to 10, preferably from 0.5 to 6, from the viewpoint of the dissolution selectivity.

It is desirable that the sum of the content of the basic compound A and the content of the basic compound A constituting the salt C in the resist developer (hereinafter referred to as "total content A") is 0.5% by weight or more, preferably 1% by weight or more, more preferably 1.5% by weight or more, from the viewpoint of promoting the dissolution in a soluble region of a resist. Also, it is desirable that the total content A is 20% by weight or less, preferably 10% by weight or less, more preferably 5.5% by weight or less, from the viewpoint of inhibiting the dissolution of a non-soluble region of a resist. Moreover, the total content A is preferably from 0.5 to 20% by weight, more preferably from 1 to 10% by weight, still more preferably from 1.5 to 5.5% by weight.

In addition, the content of the basic compound A in the resist developer is preferably from 0.1 to 19.5% by weight, more preferably from 0.5 to 10% by weight, still more preferably from 1 to 5% by weight, particularly preferably from 1.5 to 2.5% by weight, from the viewpoint of the dissolution selectivity.

The sum of the content of the organic compound B and the content of the organic compound B constituting the salt C in the resist developer (hereinafter referred to as "total content B") is preferably from 0.001 to 15% by weight, more preferably from 0.001 to 10% by weight, still more preferably from 0.001 to 4% by weight, particularly preferably from 0.05 to 3% by weight, most preferably from 0.05 to 2% by weight, from the viewpoint of the dissolution selectivity.

In the resist developer, the ratio of the sum (hereinafter referred to as "total equivalent B") of the equivalent of the organic compound B and the equivalent of the organic compound B constituting the salt C to the sum (hereinafter referred to as "total equivalent A") of the equivalent of the basic compound A and the equivalent of the basic compound A constituting the salt C (total equivalent B/total equivalent A) is preferably from 0.001 to 0.80, more preferably from 0.005 to 0.60, particularly preferably from 0.01 to 0.50, from the viewpoint of the dissolution selectivity.

Also, in the resist developer of the present invention, the ratio of the total equivalent B to the equivalent of the basic compound A (total equivalent B/equivalent of the basic compound A) is preferably from 0.001 to 4, more preferably from 0.005 to 1.5, particularly preferably from 0.01 to 1, from the viewpoint of the dissolution selectivity.

The content of the salt C in the resist developer is preferably from 0.001 to 34.5% by weight, more preferably from 0.01 to 15% by weight, still more preferably from 0.05 to 10% by weight, particularly preferably from 0.1 to 5% by weight, from the viewpoint of the dissolution selectivity.

When the resist developer contains the basic compound A and the salt C, each content of the basic compound A, the organic compound B constituting the salt C and the basic compound A constituting the salt C in the resist developer respectively can be determined, for instance, by measuring the total amine value (KOH mg/g) of the resist developer and the basic compound A itself by a method according to ASTM D2073-66, and measuring the acid value (KOH mg/g) of the organic compound B itself by a method according to JIS K0070 (1992), respectively.

Also, when an alkylene oxide compound is incorporated in the resist developer, the dissolution selectivity of the resist developer can be further improved, and the rate of the development can be accelerated. The alkylene oxide compound described herein means a compound prepared by adding an alkylene oxide to a compound having active hydrogen, such as an alcohol, a phenolic compound, an amine or a carboxylic acid, or a derivative thereof.

Examples of the alkylene oxide used in the alkylene oxide compound include ethylene oxide, propylene oxide, butylene oxide, and the like. Those compounds can be used alone or in admixture thereof. Also, those compounds can be adducts thereof in a random form or a block form.

Among the alkylene oxide compounds, it is preferable to use a compound represented by the formula (III):

wherein $R^8$ is hydrogen atom, an alkyl group having 1 to 18 carbon atoms, an aralkyl group having 7 to 18 carbon atoms, an alkenyl group having 2 to 18 carbon atoms, or an aryl group having 6 to 18 carbon atoms; $R^9$ is hydrogen atom, an alkyl group having 1 to 18 carbon atoms, or an alkenyl group having 2 to 18 carbon atoms; $y^1$ is —O— group, —COO— group or

group; A is ethylene group and/or propylene group; $y^2$ is —CO— group, or it does not exist; v is 1 or 2; w is 1 or 2; x is an integer of 1 to 100, and with the proviso that when $y^1$ is —O— group or —COO— group, the sum of v and w is 2, and that when $Y^1$ is

group, the sum of v and w is 3, a compound prepared by adding an alkylene oxide to a polyhydric alcohol or a polyamine, and the derivatives thereof, from the viewpoint of the dissolution selectivity.

Further, in the formula (III), $R^8$ is preferably hydrogen atom, an alkyl group having 1 to 12 carbon atoms, an aralkyl group having 7 to 12 carbon atoms, an alkenyl group having 2 to 12 carbon atoms or an aryl group having 6 to 15 carbon atoms, more preferably hydrogen atom, an alkyl group having 1 to 6 carbon atoms, an aralkyl group having 7 or 8 carbon atoms, an alkenyl group having 2 to 6 carbon atoms or an aryl group having 6 to 12 carbon atoms, still more preferably hydrogen atom, an alkyl group having 1 to 4 carbon atoms, an aralkyl group having 7 or 8 carbon atoms, an alkenyl group having 2 to 4 carbon atoms or an aryl group having 6 to 8 carbon atoms, from the viewpoint of the dissolution selectivity.

Also, $R^9$ is preferably hydrogen atom, an alkyl group having 1 to 12 carbon atoms, an alkenyl group having 2 to 12 carbon atoms, more preferably hydrogen atom, an alkyl group having 1 to 6 carbon atoms or an alkenyl group having 2 to 6 carbon atoms. Moreover, it is desirable that x is an integer of from 1 to 60, preferably an integer of from 1 to 50, more preferably an integer of from 1 to 30, still more preferably an integer of from 1 to 15, particularly preferably an integer of from 2 to 6.

Preferred compounds prepared by adding an alkylene oxide to a polyhydric alcohol, and derivatives thereof include compounds each prepared by adding ethylene oxide and/or propylene oxide to a polyhydric alcohol including a dihydric alcohol such as ethylene glycol, 1,3-propanediol, 1,4-butanediol, 1,5-pentanediol or 2-butene-1,4-diol; a trihydric alcohol such as glycerol or 1,2,4-butanetriol; a tetrahydric alcohol such as pentaerythritol; a pentahydric alcohol such as adonitol or arabitol; a hexahydric alcohol such as sorbitol, or the like, alkyl ether derivatives thereof, and alkyl ester derivatives thereof. Particularly, compounds prepared by adding propylene oxide to the polyhydric alcohol are preferable. Further, compounds prepared by adding propylene oxide to ethylene glycol, glycerol and pentaerythritol are most preferable.

Preferred compounds prepared by adding an alkylene oxide to a polyamine, and derivatives thereof include compounds each prepared by adding ethylene oxide and/or propylene oxide to a polyamine including a diamine such as ethylenediamine, 1,3-diaminopropane or N,N-dimethyl-1,3-propanediamine; a triamine such as diethylenetriamine; a tetramine such as triethylenetetramine, or the like, alkyl ether derivatives thereof, and alkyl ester derivatives thereof. Particularly, compounds prepared by adding propylene oxide to the polyamine are preferable. Further, compounds prepared by adding propylene oxide to ethylenediamine are most preferable.

The addition molar number of the alkylene oxide which is added to the polyhydric alcohol or the polyamine is from 2 to 100, preferably from 2 to 50, more preferably from 4 to 35, still more preferably from 8 to 25, from the viewpoint of the dissolution selectivity.

It is desirable that the content of the alkylene oxide compound in the resist developer is from 0.001 to 5% by weight, preferably from 0.0025 to 3% by weight, more preferably from 0.005 to 2% by weight, still more preferably from 0.005 to 1% by weight, from the viewpoint of the dissolution selectivity.

The resist developer of the present invention can be used in the developing process carried out after the exposure process of a positive or negative resist. In particular, the resist developer can be preferably used in the process of development in the process of lithography employed in the process for the production of semiconductor devices or liquid crystal display devices, which require fine resist patterns since the resist developer highly enhances the dissolution selectivity.

When the resist is developed using the resist developer of the present invention, there can be employed, for instance, a method for developing each of substrates such as wafer to be treated with a spinner by means of a paddling process one at a time; a method for developing some substrates at a time in a cassette by means of a dipping process, a method for developing a substrate comprising giving a substrate mechanical stress of the resist developer by means of spraying process or a process using the rotation of a spinner, and the like. Among those developing methods, it is desirable to employ the method for developing each of wafers by means of a paddling process one at a time, from the viewpoints of the reduction in the amount of consumption of the resist developer and the improvement of the dissolution selectivity. The developing temperature is preferably 10° to 60° C., more preferably 15° to 30° C.

There is no particular limitation on the kinds of a resist to which the resist developer of the present invention is applied. Examples of the resist include, for instance, a positive resist comprising an alkali-soluble novolak resin and a photodecomposition agent such as a naphthoquinone diazide compound as its constituents; a chemical amplification positive resist comprising an alkali-insoluble resin such as p-tert-butoxycarbonyloxystyrene, and an acid-generating agent such as triphenylsulfonium triflate as its constituents; a negative resist comprising an alkali-soluble novolak resin and a photosensitive agent such as an azide compound as its constituents; a chemical amplification negative resist comprising an alkali-soluble polyvinylphenol resin or a novolak resin, an acid-reactive crosslinking agent such as a melanin or silanol acid-reactive crosslinking agent and a photoacid-generating agent as its constituents, and the like.

The resist developer of the present invention shows excellent dissolution selectivity, that is, excellent properties for promoting the solubility of a resist in a soluble portion and inhibiting the solubility of a resist in a non-soluble portion. Accordingly, the resist developer forms precise fine patterns having a high resolution in a very short period of time.

EXAMPLES

The following examples illustrate the present invention but are not intended to limit the invention in any manner.

Examples 1 to 21

When TMAH is used as the basic compound A which is a main component of the resist developer, the resolution of the resist after the development greatly changes with the amount of TMAH freely existing in the resist developer. The term "content of TMAH freely existing in the resist developer" described herein means the difference between the content of all of TMAH existing in the resist developer and the content of TMAH neutralized with the organic compound B existing in the resist developer.

Accordingly, the resolution of the resist based upon the ingredients other than the basic compound A can be relatively evaluated if the content of the basic compound A freely existing in the resist developer in each example is maintained to be constant. The amount of the basic compound A to be added is the sum of the amount of the basic compound A freely existing in the resist developer and the amount of the basic compound A to be neutralized with the organic compound B.

In each example, a resist developer was prepared by mixing the basic compound A with the organic compound B so that the content of the basic compound A became a predetermined value, and adding pure water to the resulting mixture to give a resist developer having a desired concentration as shown in Table 1.

For instance, a resist developer (Example 1) containing 2.38% by weight of TMAH freely existing in the resist developer and 0.25% by weight of m-hydroxybenzoic acid was prepared in the amount of 1000 g in a manner as explained below. There was prepared an aqueous solution of TMAH (180.67 g) containing 15% by weight of TMAH, containing 27.10 g of TMAH, the sum of an amount of 23.80 g of TMAH necessary for preparing a resist developer containing 2.38% by weight of free TMAH, and an amount of 3.30 g of TMAH necessary for neutralizing m-hydroxybenzoic acid, which corresponded to 0.33% by weight of the content of TMAH freely existing in the resist developer. To the resulting aqueous solution was added 2.50 g of m-hydroxybenzoic acid, which corresponded to 0.25% by weight, and a balance of pure water to make up 1000 g of a resist developer having a desired concentration.

Incidentally, the solubility of each organic compound B used in Examples 1 to 21 to 100 parts by weight of a 2% by weight TMAH aqueous solution at 25° C. was 0.005 parts by weight or more, respectively. Also, the first dissociation constant of pKa at 25° C. of each organic compound B used in Examples 1 to 21 was 0.5 to 6, respectively.

The properties of the resist developers against a positive photoresist were evaluated in accordance with the following methods.

A positive photoresist comprising a novolak resin, a diazonaphthoquinone compound and a solvent was applied on a silicone wafer having 4 inch in diameter with a spinner. The silicone wafer was prebaked at 110° C. for 120 seconds with a hot plate to give a photoresist film having 1.5 $\mu$m in thickness.

The photoresist film was exposed to i-line spectrum having the wavelength of 365 nm through a test chart, using a minification projection exposing apparatus (stepper). Thereafter, the resist film was subjected to a paddle development with the resist developer at 23° C. for a predetermined period of time. The developed photoresist film was rinsed with pure water for 30 seconds, and then dried in a nitrogen gas stream.

The resist pattern formed on the resulting silicone wafer was observed by means of a scanning electron microscope (magnification: 25,000) to evaluate the existence of a residual resist film in the exposed region of the silicone wafer. In Table 1, the mark "◯" shows that a residual resist film was not observed; the mark "Δ" shows that a residual resist film was observed a little; and the mark "×" shows that a residual resist film was remarkably observed.

Incidentally, the term "developing period of time" in Table 1 shows the shortest time for which a residual resist film in the exposed region of the silicone wafer is evaluated as "◯".

Also, the film thickness of the resist film which was unexposed to light was measured by an ellipsometer, and the residual ratio of the resist film in the unexposed region was calculated. The residual ratio of the resist film was determined by the change in the thickness of the resist film before development (1.5 $\mu$m) and the thickness of the resist film of the unexposed portion after development. The results are shown in Table 1.

Incidentally, the resist developer having excellent dissolution selectivity is excellent in that the residuals of the resist film in the exposed region are not found, and shows a great residual ratio of the resist film in the unexposed region.

Comparative Examples 1 to 4

Using an aqueous solution (Comparative Example 1 or 2) containing TMAH only, and a resist developer (Comparative Example 3 or 4) prepared in the same manner as in Example 1, the development of a resist film was carried out in the same manner as in Example 1. The ingredients and results of evaluation of the resulting resist developers are shown in Table 1.

TABLE 1

| Ex. No. | Ingredients of Developer (% by weight) | | | Equivalent Ratio of Organic Compound B/Basic Compound A (—) | Developing Period of Time (sec) | Residue of Exposed Resist Film | Residual Ratio of Unexposed Resist (%) |
|---|---|---|---|---|---|---|---|
| | Content of Basic Compound A | | | | | | |
| | All of TMAH | Free TMAH | Organic Compound B and Its Content | | | | |
| 1 | 2.71 | 2.38 | m-Hydroxybenzoic Acid 0.25 | 0.061 | 13 | ○ | 98.5 |
| 2 | 2.71 | 2.38 | p-Hydroxybenzoic Acid 0.25 | 0.061 | 15 | ○ | 99.0 |
| 3 | 2.71 | 2.38 | Salicylic Acid 0.25 | 0.061 | 10 | ○ | 97.5 |
| 4 | 2.71 | 2.38 | Thiosalicylic Acid 0.28 | 0.061 | 10 | ○ | 97.5 |
| 5 | 2.71 | 2.38 | m-Hydroxythiobenzoic Acid 0.28 | 0.061 | 13 | ○ | 98.5 |
| 6 | 2.71 | 2.38 | p-Hydroxythiobenzoic Acid 0.31 | 0.061 | 13 | ○ | 98.0 |
| 7 | 2.71 | 2.38 | 3-Hydroxy-4-methylbenzoic Acid 0.28 | 0.061 | 10 | ○ | 97.0 |
| 8 | 2.71 | 2.38 | 3,5-di-tert-Butyl-4-hydroxybenzoic Acid 0.45 | 0.061 | 10 | ○ | 97.0 |
| 9 | 2.71 | 2.38 | 3-Hydroxy-4-methoxybenzoic Acid 0.30 | 0.061 | 10 | ○ | 97.0 |
| 10 | 2.71 | 2.38 | 3,5-Dihydroxybenzoic Acid 0.19 | 0.041 | 20 | ○ | 98.5 |
| 11 | 2.71 | 2.38 | 5-Hydroxyisophthalic Acid 0.22 | 0.041 | 10 | ○ | 97.0 |
| 12 | 2.71 | 2.38 | 1-Hydroxy-2-naphthoic Acid 0.34 | 0.061 | 10 | ○ | 97.0 |
| 13 | 2.71 | 2.38 | 1-4-Dihydroxy-2-naphthoic Acid 0.25 | 0.041 | 13 | ○ | 98.5 |
| 14 | 2.71 | 2.38 | 4'-Hydroxy-4-biphenyl-carboxylic Acid 0.39 | 0.061 | 13 | ○ | 98.5 |
| 15 | 2.71 | 2.38 | 3-Hydroxyphenylacetic Acid 0.28 | 0.061 | 13 | ○ | 98.0 |
| 16 | 2.71 | 2.38 | 3-(4-Hydroxyphenyl)-propionic Acid 0.30 | 0.061 | 10 | ○ | 97.5 |
| 17 | 2.71 | 2.38 | (±)-4-Hydroxymandelic Acid 0.30 | 0.061 | 10 | ○ | 97.5 |
| 18 | 2.71 | 2.38 | 3,4-Dihydroxyphenyl-acetic Acid 0.20 | 0.041 | 18 | ○ | 98.0 |
| 19 | 2.71 | 2.38 | 2,5-Dihydroxy-1,4-benzenediacetic Acid 0.20 | 0.030 | 13 | ○ | 97.0 |
| 20 | All of $Na_3PO_4$ 1.66 | Free $Na_3PO_4$ 1.33 | p-Hydroxybenzoic Acid 0.28 | 0.066 | 20 | ○ | 97.0 |
| 21 | All of KOH 1.66 | Free KOH 1.33 | p-Hydroxybenzoic Acid 0.141 | 0.099 | 18 | ○ | 97.0 |
| Comp. Ex. No. | | | | | | | |
| 1 | 2.38 | 2.38 | — | — | 70 | ○ | 91.0 |
| 2 | 2.38 | 2.38 | — | — | 40 | Δ | 94.0 |
| 3 | 2.71 | 2.38 | Isophthalic Acid* 0.30 | 0.061 | 25 | ○ | 95.0 |
| 4 | 2.71 | 2.38 | Phenol* 0.34 | 0.122 | 35 | ○ | 90.0 |

(Note)
*: Not falling under the definition of the organic compound B.

As is clear from the above results, it can be seen that when a resist is developed with each of the resist developers of the present invention (Examples 1 to 21), which is prepared by adding the organic compound B to an aqueous solution of the basic compound A, a resist pattern having high dissolution selectivity is formed, with the inhibition of a decrease of the resist film in the unexposed region, as compared with the cases where the resist developers (Comparative Example 1 or 2) containing TMAH only, and the resist developer (Comparative Example 3 or 4) prepared by adding a carboxylic acid which does not have phenolic hydroxyl group in a molecule or phenol to a TMAH aqueous solution are used. Also, when the resist developers of the present invention are used, the period of time necessary for the development can be shortened.

Examples 22 to 37 and Comparative Example 5

Using the resist developer composed of a TMAH aqueous solution containing an alkylene oxide compound (Comparative Example 5), and resist developers of the present invention prepared by adding an alkylene oxide compound to the resist developer obtained in Example 1, 2, 10, 12, 15 or 18, the development of a resist film was carried out in the same manner as in Example 1. The ingredients and results of evaluation of the resulting resist developers are shown in Table 2.

The abbreviations used in Table 2 are as follows: MG is ethylene glycol monomethyl ether; BDG, diethylene glycol monobutyl ether; BEDG, diethylene glycol butyl ethyl ether; HDG, diethylene glycol monohexyl ether; EOPOL, lauryl ether of a block copolymer of 5 mol of ethylene oxide and 5 mol of propylene oxide; EGEO, polyethylene glycol (addition molar number of ethylene oxide being 4 mol); PhDG, diethylene glycol monophenyl ether; POEH, polyoxyethylene hexyl ether acetate (addition molar number of ethylene oxide being 6 mol); POEB, polyoxyethylene butylamine (addition molar number of ethylene oxide being 10 mol); EOPO, ethylene oxide-propylene oxide copolymer [ethylene oxide/propylene oxide (molar ratio): 7/1; average molecular weight: about 3000, pluronic-type]; PENTAPO, pentaerythritol propylene oxide adduct (addition molar number of propylene oxide being 17 mol); GLYPO, glycerol propylene oxide adduct (addition molar number of propylene oxide being 15 mol); EDAPO, ethylenediamine propylene oxide adduct (addition molar number of propylene oxide being 16 mol); and POESORTO, polyoxyethylene sorbitol tetraoleate (addition molar number of ethylene oxide being 60 mol).

the resist is developed with an aqueous solution of an alkylene oxide compound and TMAH (Comparative Example 5). Also, it can be seen that when the resist developers of the present invention are used, the period of time necessary for the development can be shortened.

As explained above, the resist developer of the present invention exhibits excellent effects in the dissolution selectivity in that the resist developer promotes the solubility of a soluble portion of a resist, while it inhibits the solubility of a non-soluble portion of a resist, and moreover that the resist developer can shorten the period of time necessary for the development.

EQUIVALENT

Those skilled in the art will recognize, or be able to ascertain using no more than routine experimentation, many equivalents to the specific embodiments of the present invention described specifically herein. Such equivalents are intended to be encompassed in the scope of the following claims.

What is claimed is:

1. A resist developer obtained by a process comprising mixing:
   (1) at least one compound selected from the group consisting of a basic compound A and an organic compound B having phenolic hydroxyl group and carboxyl group in a molecule, with
   (2) a salt C formed between the basic compound A and the organic compound B,
   wherein said basic compound A is represented by the formula (II):

TABLE 2

| | Ingredients of Developer (% by weight) | | | | Developing Period of Time (sec) | Residue of Exposed Resist Film | Residual Ratio of Unexposed Resist (%) |
|---|---|---|---|---|---|---|---|
| | Content of Free TMAH | Alkylene Oxide Compound and Its Content | | Organic Compound B and Its Content | | | |
| Ex. No. | | | | | | | |
| 22 | 2.38 | MG | 0.05 | m-Hydroxybenzoic Acid | 0.25 | 10 | ○ | 99.5 |
| 23 | 2.38 | MG | 2.00 | m-Hydroxybenzoic Acid | 0.25 | 10 | ○ | 98.5 |
| 24 | 2.38 | BDG | 0.01 | p-Hydroxybenzoic Acid | 0.25 | 12 | ○ | 99.5 |
| 25 | 2.38 | BDG | 0.10 | p-Hydroxybenzoic Acid | 0.25 | 10 | ○ | 99.0 |
| 26 | 2.38 | BEDG | 0.10 | 3,5-Dihydroxybenzoic Acid | 0.19 | 15 | ○ | 99.0 |
| 27 | 2.38 | HDG | 0.10 | 3,4-Dihydroxyphenyl-acetic Acid | 0.20 | 15 | ○ | 98.5 |
| 28 | 2.38 | EOPOL | 0.01 | 1-Hydroxy-2-naphthoic Acid | 0.34 | 10 | ○ | 98.0 |
| 29 | 2.38 | EGEO | 0.05 | m-Hydroxybenzoic Acid | 0.25 | 10 | ○ | 99.0 |
| 30 | 2.38 | PhDG | 0.05 | 3,5-Dihydroxybenzoic Acid | 0.19 | 15 | ○ | 99.0 |
| 31 | 2.38 | POEH | 0.05 | 3,4-Dihydroxyphenyl-acetic Acid | 0.20 | 15 | ○ | 98.5 |
| 32 | 2.38 | POEB | 0.05 | p-Hydroxybenzoic Acid | 0.25 | 10 | ○ | 99.0 |
| 33 | 2.38 | EOPO | 0.01 | 3,4-Dihydroxyphenyl-acetic Acid | 0.20 | 15 | ○ | 98.5 |
| 34 | 2.38 | PENTAPO | 0.01 | p-Hydroxybenzoic Acid | 0.25 | 8 | ○ | 99.5 |
| 35 | 2.38 | GLYPO | 0.01 | p-Hydroxybenzoic Acid | 0.25 | 8 | ○ | 99.5 |
| 36 | 2.38 | POESORTO | 0.01 | m-Hydroxybenzoic Acid | 0.25 | 8 | ○ | 99.0 |
| 37 | 2.38 | EDAPO | 0.01 | m-Hydroxybenzoic Acid | 0.25 | 8 | ○ | 99.0 |
| Comp. Ex. No. | | | | | | | |
| 5 | 2.38 | EOPO | 0.05 | — | | 56 | ○ | 85.2 |

As is clear from the results shown in Table 2, it can be seen that when the resist is developed with the resist developers of the present invention (Examples 22 to 37), a resist pattern having high dissolution selectivity can be formed, with the inhibition of the decrease of the resist film in the unexposed region, as compared with the case where

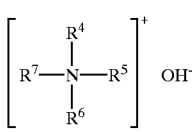
(II)

wherein each of $R^4$, $R^5$, $R^6$, and $R^7$ is independently an alkyl group having 1 to 6 carbon atoms, an aralkyl group having 7 or 8 carbon atoms, an alkenyl group having 2 to 6 carbon atoms, an aryl group having 6 to 8 carbon atoms, a hydroxyalkyl group having 1 to 6 carbon atoms or an alkoxyalkyl group having 2 to 6 carbon atoms, wherein a ratio of a sum of an equivalent of the organic compound B and an equivalent of the organic compound B constituting the salt C to a sum of an equivalent of the basic compound A and an equivalent of the basic compound A constituting the salt C is from 0.001 to 0.80, and wherein a sum of a content of the basic compound A and a content of the basic compound A constituting the salt C is from 1 to 10% by weight.

2. A resist developer obtained by a process comprising mixing a basic compound A and an organic compound B having phenolic hydroxyl group and carboxyl group in a molecule, whereby a salt C is formed, wherein said basic compound A is represented by the formula (II):

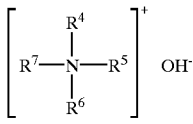
(II)

wherein each of $R^4$, $R^5$, $R^6$, and $R^7$ is independently an alkyl group having 1 to 6 carbon atoms, an aralkyl group having 7 or 8 carbon atoms, an alkenyl group having 2 to 6 carbon atoms, an aryl group having 6 to 8 carbon atoms, a hydroxyalkyl group having 1 to 6 carbon atoms or an alkoxyalkyl group having 2 to 6 carbon atoms, wherein a ratio of a sum of an equivalent of the organic compound B and an equivalent of the organic compound B constituting the salt C to a sum of an equivalent of the basic compound A and an equivalent of the basic compound A constituting the salt C is from 0.001 to 0.80, and wherein a sum of a content of the basic compound A and a content of the basic compound A constituting the salt C is from 1 to 10% by weight.

3. A resist developer comprising a salt C formed between a basic compound A and an organic compound B having phenolic hydroxyl group and carboxyl group in a molecule, and further comprising at least one of the basic compound A and the organic compound B, wherein said basic compound A is represented by the formula (II):

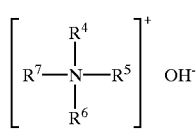
(II)

wherein each of $R^4$, $R^5$, $R^6$, and $R^7$ is independently an alkyl group having 1 to 6 carbon atoms, an aralkyl group having 7 or 8 carbon atoms, an alkenyl group having 2 to 6 carbon atoms, an aryl group having 6 to 8 carbon atoms, a hydroxyalkyl group having 1 to 6 carbon atoms or an alkoxyalkyl group having 2 to 6 carbon atoms, wherein a ratio of a sum of an equivalent of the organic compound B and an equivalent of the organic compound B constituting the salt C to a sum of an equivalent of the basic compound A and an equivalent of the basic compound A constituting the salt C is from 0.001 to 0.80, and wherein a sum of a content of the basic compound A and a content of the basic compound A constituting the salt C is from 1 to 10% by weight.

4. The resist developer according to claim 1, wherein said organic compound B is a compound represented by the formula (I):

(I)

wherein $R^1$ is a linear or branched, saturated or unsaturated hydrocarbon group having 1 to 4 carbon atoms, wherein the hydrocarbon group of $R^1$ may have one oxygen atom; $R^2$ is an unsaturated hydrocarbon group comprising a cyclic skeleton having 6 to 14 carbon atoms; $R^3$ is a linear or branched, saturated or unsaturated hydrocarbon group having 1 to 4 carbon atoms, wherein hydrogen atom bonded to carbon atom of $R^3$ may be substituted by —OH group, and at least one oxygen atom of q number of —OH group may be substituted by sulfur atom; at least one oxygen atom of r number of —COOH group may be substituted by sulfur atom; p is an integer of 0 to 3; q is an integer of 1 to 3; s is 0 or 1; and r is 1 or 2.

5. The resist developer according to claim 1, further comprising an alkylene oxide compound.

6. The resist developer according to claim 1, wherein said ratio is from 0.01 to 0.50.

7. The resist developer according to claim 2, wherein said ratio is from 0.01 to 0.50.

8. The resist developer according to claim 3, wherein said ratio is from 0.01 to 0.50.

9. The resist developer according to claim 1, wherein each of $R^4$, $R^5$, $R^6$, and $R^7$ in the formula (II) is independently an alkyl group having 1 to 4 carbon atoms.

10. The resist developer according to claim 2, wherein each of $R^4$, $R^5$, $R^6$, and $R^7$ in the formula (II) is independently an alkyl group having 1 to 4 carbon atoms.

11. The resist developer according to claim 3, wherein each of $R^4$, $R^5$, $R^6$, and $R^7$ in the formula (II) is independently an alkyl group having 1 to 4 carbon atoms.

12. The resist developer according to claim 1, wherein each of $R^4$, $R^5$, $R^6$, and $R^7$ in the formula (II) is independently an alkyl group having 1 to 2 carbon atoms.

13. The resist developer according to claim 2, wherein each of $R^4$, $R^5$, $R^6$, and $R^7$ in the formula (II) is independently an alkyl group having 1 to 2 carbon atoms.

14. The resist developer according to claim 3, wherein each of $R^4$, $R^5$, $R^6$, and $R^7$ in the formula (II) is independently an alkyl group having 1 to 2 carbon atoms.

15. The resist developer according to claim 1, wherein said basic compound A is tetramethylammonium hydroxide or trimethylhydroxyethylammonium hydroxide.

16. The resist developer according to claim 2, wherein said basic compound A is tetramethylammonium hydroxide or trimethylhydroxyethylammonium hydroxide.

17. The resist developer according to claim 3, wherein said basic compound A is tetramethylammonium hydroxide or trimethylhydroxyethylammonium hydroxide.

18. The resist developer according to claim 4, wherein in the formula (I) q is 1 or 2, s is 0, r is 1 and p is 0.

19. The resist developer according to claim 4, wherein said organic compound B is m-hydroxybenzoic acid, p-hydroxybenzoic acid or 2,4-dihydroxybenzoic acid.

20. The resist developer according to claim 1, wherein the resist developer is used in a process of lithography employed in a process for production of semiconductor devices or liquid crystal display devices.

21. A method for developing a resist, comprising applying the resist developer according to any one of claims 1 to 3, 5, 6 and 8 to 20.

22. The resist developer according to claim 1, wherein a ratio of a sum of an equivalent of the organic compound B and an equivalent of the organic compound B constituting the salt C to a sum of an equivalent of the basic compound A and an equivalent of the basic compound A constituting the salt C is from 0.005 to 0.60.

* * * * *